United States Patent
Iwasaki et al.

(10) Patent No.: US 6,784,549 B2
(45) Date of Patent: Aug. 31, 2004

(54) SEMICONDUCTOR DEVICE HAVING A CAPACITOR AND A METAL INTERCONNECT LAYER WITH TUNGSTEN AS A MAIN CONSTITUENT MATERIAL AND CONTAINING MOLYBDENUM

(75) Inventors: Tomio Iwasaki, Tsukuba (JP); Hideo Miura, Koshigaya (JP); Takashi Nakajima, Chiyoda (JP); Hiroyuki Ohta, Tsuchiura (JP); Shinji Nishihara, Kokubunji (JP); Masashi Sahara, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/395,248

(22) Filed: Mar. 25, 2003

(65) Prior Publication Data

US 2003/0160267 A1 Aug. 28, 2003

Related U.S. Application Data

(63) Continuation of application No. 10/252,685, filed on Sep. 24, 2002, now Pat. No. 6,548,904, which is a continuation of application No. 09/758,288, filed on Jan. 12, 2001, now Pat. No. 6,476,492.

(30) Foreign Application Priority Data

Jan. 14, 2000 (JP) .......................................... 2000-10107

(51) Int. Cl.$^7$ .......................... H01L 23/48; H01L 23/52; H01L 29/40
(52) U.S. Cl. ...................................... 257/758; 257/295
(58) Field of Search .................................. 257/758, 295

(56) References Cited

U.S. PATENT DOCUMENTS

| | | | | |
|---|---|---|---|---|
| 5,418,388 A | | 5/1995 | Okudaira et al. | 257/295 |
| 5,612,254 A | * | 3/1997 | Mu et al. | 438/634 |
| 5,699,291 A | | 12/1997 | Tsunemine | 365/149 |
| 5,798,545 A | * | 8/1998 | Iwasa et al. | 257/301 |
| 5,817,572 A | | 10/1998 | Chiang et al. | 438/624 |
| 5,981,374 A | | 11/1999 | Dalal et al. | 438/624 |
| 6,177,284 B1 | | 1/2001 | Horii et al. | 438/3 |
| 6,287,951 B1 | | 9/2001 | Lucas et al. | 438/618 |
| 6,548,904 B2 | * | 4/2003 | Iwasaki et al. | 257/758 |

FOREIGN PATENT DOCUMENTS

JP 10-116905 5/1998

* cited by examiner

*Primary Examiner*—David Nelms
*Assistant Examiner*—Tu-Tu Ho
(74) *Attorney, Agent, or Firm*—Antonelli, Terry, Stout & Kraus, LLP

(57) ABSTRACT

In a semiconductor device, which comprises a capacitor component comprising a first electrode, an oxide film with a high dielectric constant or ferroelectricity in contact with the first electrode and a second electrode in contact with the oxide film, as formed in this order, on one principal side of a silicon substrate with a metal wiring layer formed thereon, such problems as breaking of tungsten interconnect, lowering of reliability, lowering of yield, etc. of semi-conductor devices can be solved by using molybdenum-containing tungsten as the material of metal interconnect layer.

13 Claims, 9 Drawing Sheets

SEMICONDUCTOR DEVICE HAVING A CAPACITOR AND A METAL INTERCONNECT LAYER WITH TUNGSTEN AS A MAIN CONSTITUENT MATERIAL AND CONTAINING MOLYBDENUM

This is a continuation of application Ser. No. 10/252,685, filed Sep. 24, 2002, now U.S. Pat. No. 6,548,904 which is a continuation of 09/758,288, filed Jan. 12, 2001 (now U.S. Pat. No. 6,476,492), the entire disclosures of which are hereby incorporated by reference.

BACKGROUND OF THE INVENTION

The present invention relates to a semiconductor device and a process for producing the same.

With the recent trend toward finer semiconductor devices, the area of information storage capacitor component has become smaller and smaller and the absolute value of capacitance has also become smaller and smaller. In case of a parallel flat plate electrode structure, a capacitance C can be defined by the following equation:

$$C = \epsilon \cdot S/d$$

where $\epsilon$ is a permittivity of dielectric, S an area of electrode and d a film thickness (interelectrode distance) of dielectric. To secure a capacitance without increasing the area S of electrode used in the information storage capacitor component, it is necessary to use a dielectric material with a high permittivity $\epsilon$ or make the film thickness d of dielectric smaller. The thickness of a thin oxide film is now made as small as about 10 nm, and in case of memory of high integration level of 64 M bits or more, an effort to make capacitor dielectric films thinner is almost reaching the limits, and thus development of capacitor insulation film materials with a higher dielectric constant $\epsilon$ is in progress, and use of tantalum oxide or barium strontium titanate ($Ba_xSr_yTi_zO_t$: BST) or the like is now investigated. As in case of tantalum oxide or barium strontium titanate, the dielectric constant is called "a high dielectric constant", if a dielectric constant is 5 or more. Furthermore, use of a ferroelectric such as lead titanate zirconate ($Pb_xZr_yTi_zO_t$: PZT), etc. is also now investigated for the nonvolatile memory.

It is known that oxides such as tantalum oxide, BST, PZT, etc. fail to show better characteristics, if not heat treated, and thus it is necessary to conduct heat treatment at about 600° C. or higher, preferably at about 700° C. or higher after the formation of an oxide film. For metallic wiring susceptible to the heat treatment, e.g. tungsten, as disclosed in JP-A-10-116905, is used as a high melting point metal.

However, when the aforementioned prior art was applied to semiconductor devices such as 256 M bit DRAM or system LSI (semiconductor device with memory LSI and logic LSI mounted together on a single chip), such problems as breaking of tungsten interconnects, lowering of semiconductor device reliability, lowering of yield, etc. were encountered in some cases.

SHORT SUMMARY OF THE INVENTION

The present invention has been established to dissolve at least one of the aforementioned problems.

The present invention provides a semiconductor device, which comprises a semiconductor substrate; a metal interconnect composed of tungsten as the main constituent material and containing molybdenum, formed on one principal side of the semiconductor substrate; and a capacitor component comprising a first electrode formed on the one principal side of the semiconductor substrate, an oxide film with a high dielectric constant or ferroelectricity formed in contact with the first electrode, and a second electrode formed in contact with the oxide film.

The present invention further provides a process for producing a semiconductor device, which comprises a step of providing a semiconductor substrate; a step of forming a metal interconnect, composed of tungsten as the main constituent material and containing molybdenum on one principal side of the semiconductor substrate; a step of forming a first electrode on the one principal side of the semiconductor substrate; a step of forming an oxide film with a high dielectric constant or ferroelectricity so as to be in contact with the first electrode and then heating the oxide at a temperature of 600° C. or higher; and a step of forming a second electrode in contact with the oxide film.

Figure 1:
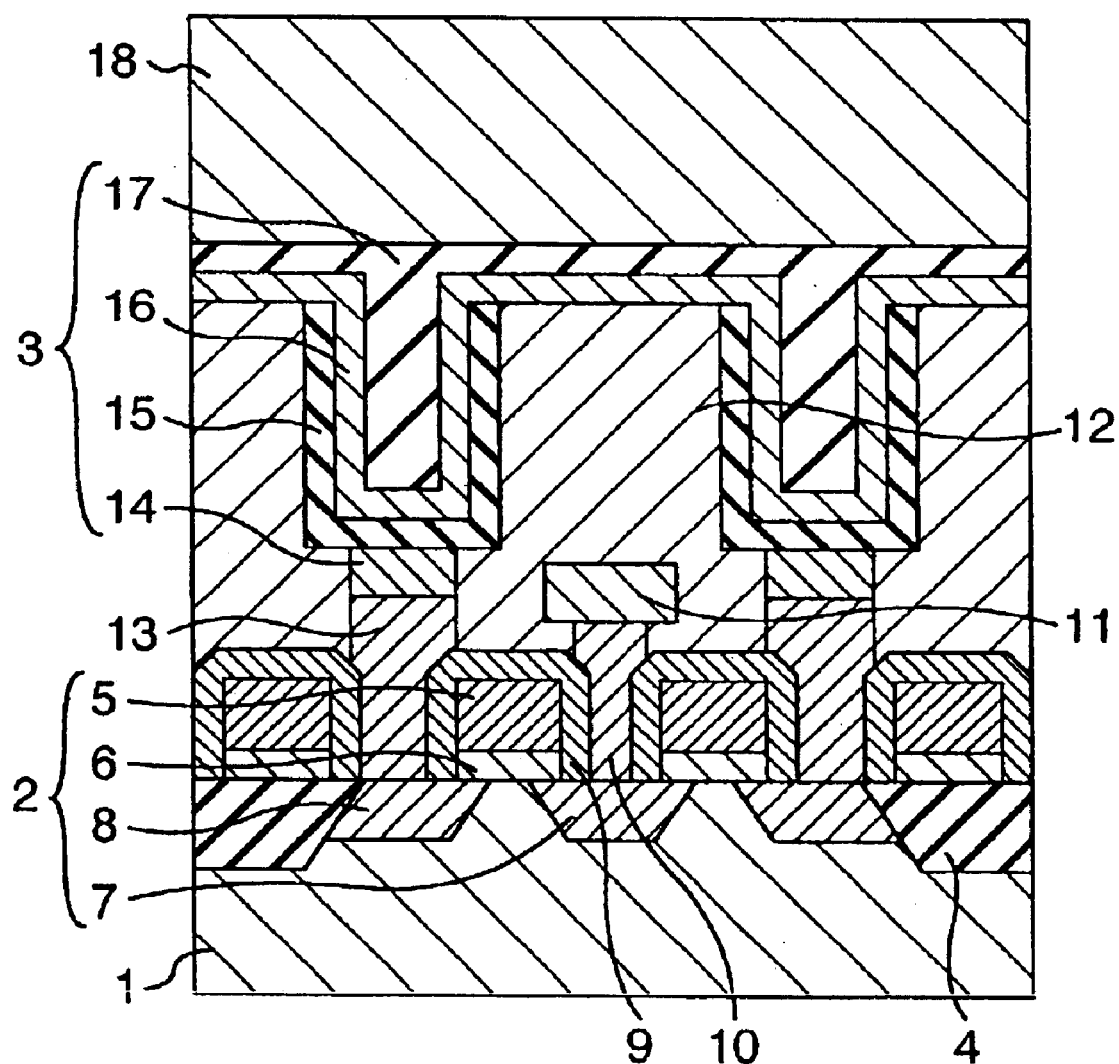
FIG. 1 is a cross-sectional view of the principal part of a semiconductor device according to Example 1 of the present invention.

In the foregoing drawings, reference numerals have the following denotation.

1 . . . silicon substrate, 2 . . . transistor, 3 . . . information storage capacitor component, 4 . . . component isolation film, 5 and 105 . . . gate electrodes, 6 and 106 . . . gate insulation films, 7 and 6 . . . diffusion layers, 9 . . . insulation film, 10, 10a and 10b . . . plugs, 11 . . . bit wire, 12 . . . insulation film, 13 and 110 . . . plugs, 14 . . . conductive film, 15 . . . capacitor lower electrode, 16 . . . capacitor insulation film, 17 . . . capacitor upper electrode, 18 . . . insulation film, 19, 20, 21, 22 and 23 . . . conductive films, 100 . . . logic LSI, 102 . . . MOS transistor, 111 and 112 . . . wirings, and 113 . . . barrier film.

DETAILED DESCRIPTION OF THE INVENTION

The present inventors have made extensive studies to solve the aforementioned problems and have found that breads of tungsten interconnect, which is one of the problems to be solved by the present invention, proceeds by diffusion of tungsten atoms near the crystal grain boundary and further that, to control the grain boundary diffusion of the atoms in the tungsten wiring it is effective to add to the tungsten interconnect such an element as to narrow the interatomic distance of tungsten crystal in the tungsten interconnect (additive element).

In the present invention, the problem can be solved, for example, by a semiconductor device, which comprises a semiconductor substrate, typically a silicon substrate; a metal interconnect (metal interconnect layer) composed of tungsten as the main constituent material (where the main constituent material means a material contained in the largest around in a metal wiring layer) and containing molybdenum, formed on one principal side of the semiconductor substrate; and a capacitor component comprising a first electrode (capacitor lower electrode) formed on the one principal side of the semiconductor substrate, an oxide film with a high dielectric constant (a dielectric constant of 5 or more) or ferroelectrocity formed in contact with the first electrode, and a second electrode (capacitor upper electrode) formed in contact with the oxide film. It is necessary to conduct a heat treatment of the oxide film with a high dielectric constant or ferroelectricity typically of tantalum oxide, barium strontium titanate (BST), lead titanate zirconate (PZT), etc. (at 600° C. or higher, desirably 700° C. or higher) after the film formation. It has been found that the conventional tungsten interconnect will be broken by the heat treatment.

In the semiconductor device of the foregoing structure, the interconnect can be prevented from breaking by using a metal interconnect composed of tungsten as the main constituent material and containing molybdem. Effective molybdenum content is 0.05 at %–18 at. %, preferably 0.1 at. %–15 at. %.

Breaking of an interconnect is pronounced particularly when the interconnect width is 0.2 μm or less, and thus the foregoing structure is an very essential structure for semiconductor devices with an interconnect width of 0.2 μm or less. That is, the foregoing structure is a very essential structure for semiconductor devices with a logic LSI including memory LSI and MOS transistor mounted thereon.

Preferable modes of the present semiconductor device and a process for producing the same are as follows:

(1) A semiconductor device, which comprises a semiconductor substrate; a metal interconnect composed of tungsten as the main constituent material and containing molybdenum formed on one principal side of the semiconductor substrate; and a capacitor component comprising a first electrode formed on the one principal side of the semiconductor substrate, an oxide film with a high dielectric constant or ferroelectricity formed in contact with the first electrode, and a second electrode formed in contact with the oxide film.

(2) A semiconductor device of the foregoing (1), wherein the metal interconnect has a line width of 0.2 μm or less.

(3) A semiconductor device of the foregoing (1), wherein the main constituent material of the oxide film is a material selected from the group consisting of tantalum oxide, barium strontium titanate (BST) and lead titanate zirconate (PZT).

(4) A semiconductor device of the foregoing (1), wherein the content of molybdenum of the wiring is 0.05 at. %–18 at. %.

(5) A semiconductor device, which comprises a silicon substrate; a metal interconnect line with a line width of 0.2 μm or less composed of tungsten as the main constituent material and containing 0.05 at. %–18 at. % of molybdenum, formed on one principal side of the silicon substrate; and a capacitor component comprising a first electrode formed on the one principal side of the silicon substrate, an oxide film selected from the group consisting of tantalum oxide, barium strontium titanate (BST) and lead titanate zirconate (PZT), formed in contact with the first electrode and a second electrode formed in contact with the oxide film.

(6) A semiconductor device, which comprises a semiconductor substrate with a metal wiring layer formed thereon; a memory LSI comprising a capacitor component comprising a first electrode, an oxide film with a high dielectric constant or ferroelectricity, formed in contact with the first electrode and a second electrode formed in contact with the oxide film; and a logic LSI comprising a MOS transistor with a gate oxide film and a gate electrode formed thereon, the memory LSI and the logic LSI being mounted on one principal side of the semiconductor substrate, characterized in that the main constituent material of the metal interconnect layer is tungsten and the metal wiring layer contains molybdenum.

(7) A semiconductor device, which comprises a memory LSI comprising a first electrode, an oxide film with a high permittivity or ferroelectricity in contact with the first electrode and a second electrode in contact with the oxide film, as formed in this order, and a logic LSI comprising a MOS transistor with a gate oxide film and a gate electrode formed thereon, the memory LSI and the logic LSI being mounted on one principal side of a silicon substrate with a metal interconnect layer formed thereon, characterized in that the main constituent material of the oxide film is a material selected from the group consisting of tuntalum oxide, barium strontium titanate (BST) and lead titanate zirconate (PZT), the line width of the metal interconnect layer is 0.2 μm or less, the main constituent material of the metal interconnect layer is tungsten and the metal interconnect layer contains 0.05 at. %–18 at. % of molybdenum.

(8) A process for producing a semiconductor device, which comprises a step of providing a semiconductor substrate; a step of forming a metal interconnect, composed of tungsten as the main constituent material and containing molybdenum on one principal side of the semiconductor substrate; a step of forming a first electrode on the one principal side of the semiconductor substrate; a step of forming an oxide film with a high dielectric constant or ferroelectricity so as to be in contact with the first electrode and then heating the oxide at a temperature of 600° C. or higher; and a step of forming a second electrode in contact with the oxide film.

(9) A process for producing a semiconductor device, which comprises a step of providing a silicon substrate; a step of forming a metal interconnect with a line width of 0.2 μm or less, composed of tungsten as the main constituent material and containing 0.05 at. %–18 at. % of molybdenum on one principal side of the silicon substrate; a step of forming a first electrode on the one principal side of the silicon substrate; a step of forming an oxide film selected from the group consisting of tantalum oxide, barium strontium titanate (BST) and lead titanate zirconate (PZT) in contact with the first electrode and then heating the oxide at a temperature of 700° C. or higher; and a step of forming a second electrode in contact with the oxide film after the completion of the heating step.

Embodiments of the present invention will be described in detail below, referring Examples shown in the drawings.

EXAMPLE 1

Figure 2:
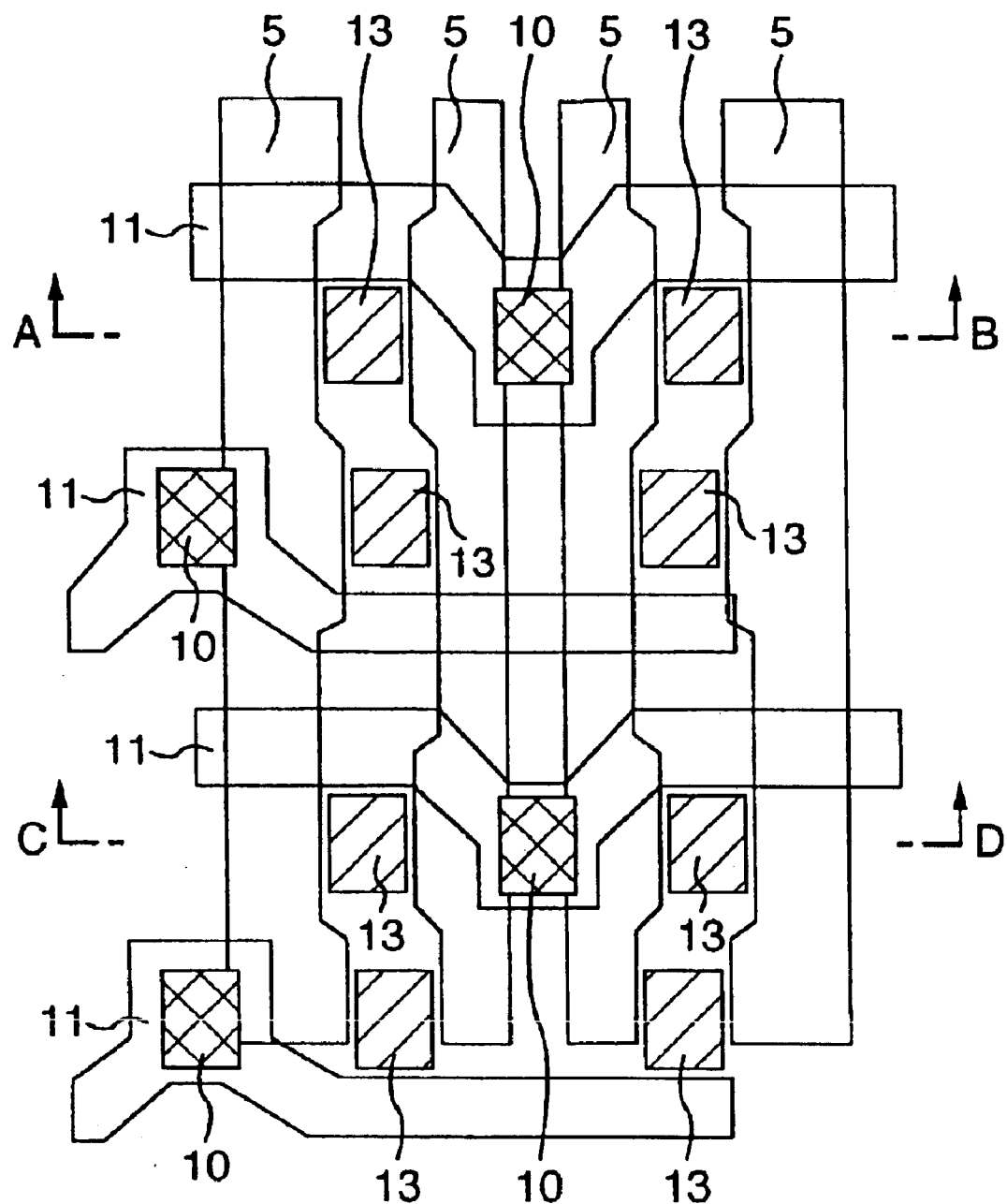
FIG. 2 is a view showing an example of plan layout at a semiconductor device.

Cross-sectional structure of DRAM (Dynamic Random Access Memory) memory cell is shown in FIG. 1 as a first embodiment of the present semiconductor device. FIG. 1 is a cross-sectional view along A-B or C-D in an example of plan layout shown in FIG. 2. The semiconductor device of this Example comprises a MOS (Metal Oxide Semiconductor) type transistor formed in the active region on the principal plane of silicon substrate 1 as a semiconductor and information storage capacitor component 3 (which may be hereinafter referred to as "capacitor component") provided thereon. Insulation film 12 is a film for isolation between components.

MOS transistor 2 of the memory cell comprises gate electrode 5, gate insulation film 6 and diffusion layer 7. Gate insulation film 6 consists of, for example, a silicon oxide film, a silicon nitride film or a ferroelectric film or is in a laminate structure of these films. Gate electrode 5 consists of, for example, a polycrystalline silicon film, a thin metal film, or a metal silicide film or is in a laminate structure of these films. Insulation film 9 consisting of, for example, silicon oxide film is formed on the top and side walls of said gate electrode 5. Bit line 11 is connected to diffusion layer 7 on one side of MOS transistor for memory cell selection through plug 10. Insulation film 12 consisting of, for example, a BPSG (Boron-doped Phospho-Silicate Glass) film, an SOG (Spin On Glass film or a silicon oxide film, a nitride film of the like formed by chemical vapor deposition or sputtering is formed all over the MOS transistor.

Information storage capacitor component 3 is formed at the upper part of insulation film 12 covering the MOS transistor. Information storage capacitor component 3 is connected to diffusion layer 8 on the other side of MOS transistor for memory cell selection through plug 13 consisting of, for example, polycrystalline silicon. Information storage capacitor component 3 is in a laminate structure made up, in the order from the lowest layer upwards, of conductive barrier film 14, capacitor lower electrode 15, oxide film 6 with a high permittivity or ferroelecticity and capacitor upper electrode 17. Information storage capacitor component 3 is covered with insulation film 18.

In the semiconductor device of this Example, oxides such as tantalum oxide, BST, PZT, etc. are used as the main constituent material for oxide film 16. Tungsten is used for bit line 11 and the maximum width of the wiring is 0.2 $\mu$m.

Reason why high melting point tungsten is used for bit line 11 is that the bit line should not be melted even by heat treatment at 600° C.–700° C. or higher for improving the characteristics of oxide film 16.

In this Example, molybdenum is contained as an additive element so that the bit line may not be broken even by the heat treatment.

Effects of this Example will be described below.

Oxide such as tantalum oxide, BST, PZT, etc. as the main constituent material for oxide film 16 can have distinguished characteristics upon heat treatment and thus are heat treated at about 600° C.–700° C. or higher after the formation of an oxide film. It is preferable to use a high melting point tungsten, etc. for bit line 11 so that bit line 11 may not be broken even upon exposure to high temperatures of 600° C.–700° C. or higher. However, it has been experimentally clarified that, even if tungsten is used for the bit line, the bit line is sometimes broken when the width of bit line is 0.2 $\mu$m or less. The present inventors have found that breaking of bit line 11 is caused to take place by activation of diffusion at the crystal grain boundary of tungsten atoms by heat. The present inventors have found that the grain boundary diffusion can be controlled by adding molybdenum as an additive element to the bit line composed of tungsten, thereby preventing the breaking. To elucidate this effect, results of calculating diffusion coefficient of tungsten atoms at the crystal grain boundary by molecular dynamics simulation will be shown below. Molecular dynamics simulation is a method of calculating forces acting on individual atoms through interatomic potentials and solving Newton's equation of motion on the basis of these forces, thereby computing positions of individual atoms from time to time, as disclosed, for example, in Journal of Applied Physics, vol. 54 (published in 1983), pages 4864–4878. A method of calculating diffusion coefficient by molecular dynamics simulation is disclosed, for example, in Physical Review B, vol. 29 (published in 1954), pages 5363–6371. In this example, explanation will be made, referring to an example of calculating diffusion coefficient of tungsten atoms at crystal grain boundary by setting the temperature to 1,000K. The effect to be elucidated herein can also valid even if simulation conditions such as temperature, etc. are changed.

Figure 3:
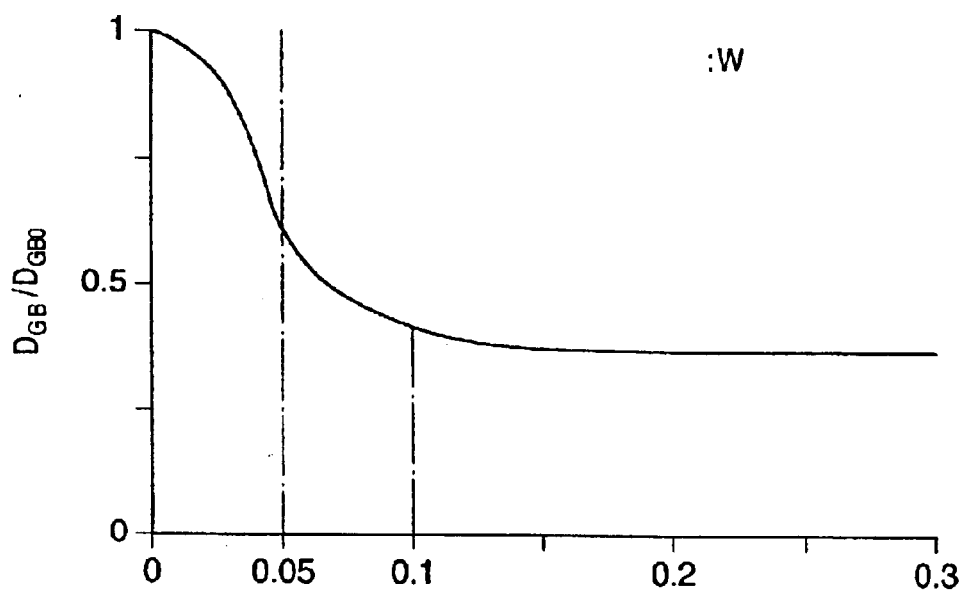
FIG. 3 is a diagram showing a dependency of grain boundary diffusion coefficient of tungsten on added molybdenum concentration in a low concentration range.
Figure 4:
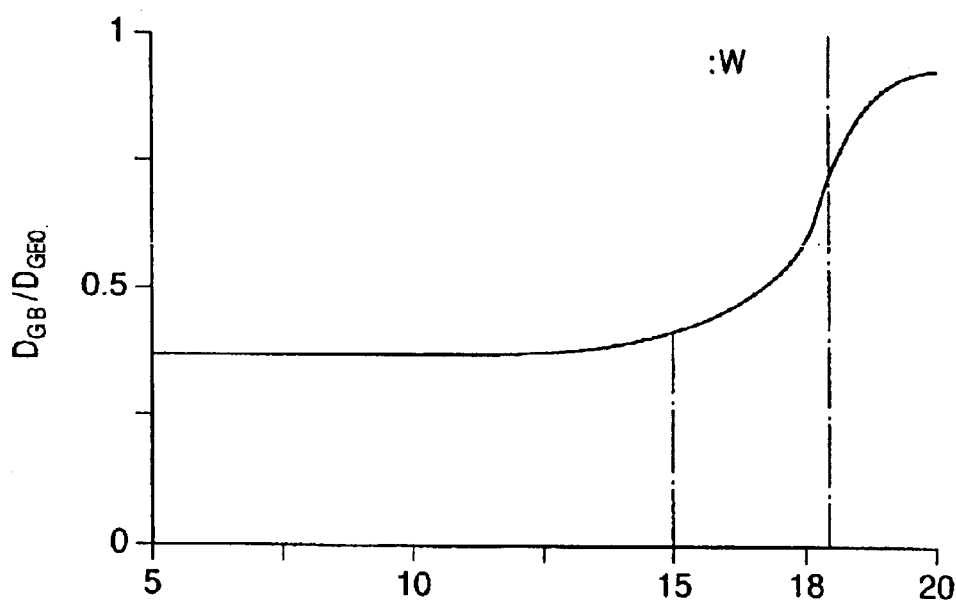
FIG. 4 is a diagram showing a dependency of grain boundary coefficient of tungsten on added molybdenum concentration in a higher concentration range.

In this Example, the following effect has been clarified by calculating interactions between different kinds of elements by incorporating charge transfer into the aforementioned molecular dynamics method. Results of analyzing dependency of diffusion coefficient at grain boundary on molybdenum concentration are shown in FIGS. 3 and 4. FIGS. 4 and 4 show dependency on the concentration in a low concentration region and a high concentration, respectively. As is apparent from FIG. 3, the effect of controlling diffusion becomes remarkable at an additive concentration of 0.05 at. % or more. The effect is saturated at about 0.1 at. % or more and substantially maximum effect can be obtained. Thus, a preferable additive concentration is about 0.1 at. % or more. As is evident from FIG. 4, the effect of controlling diffusion becomes lower at an additive concentration of about 15 at. % or more. The effect of controlling diffusion becomes much lower at an additive concentration of about 18 at. % or more. This is because too much additive element disturbs crystal structure of tungsten as the main constituent material, activating the diffusion.

EXAMPLE 2

Figure 5:
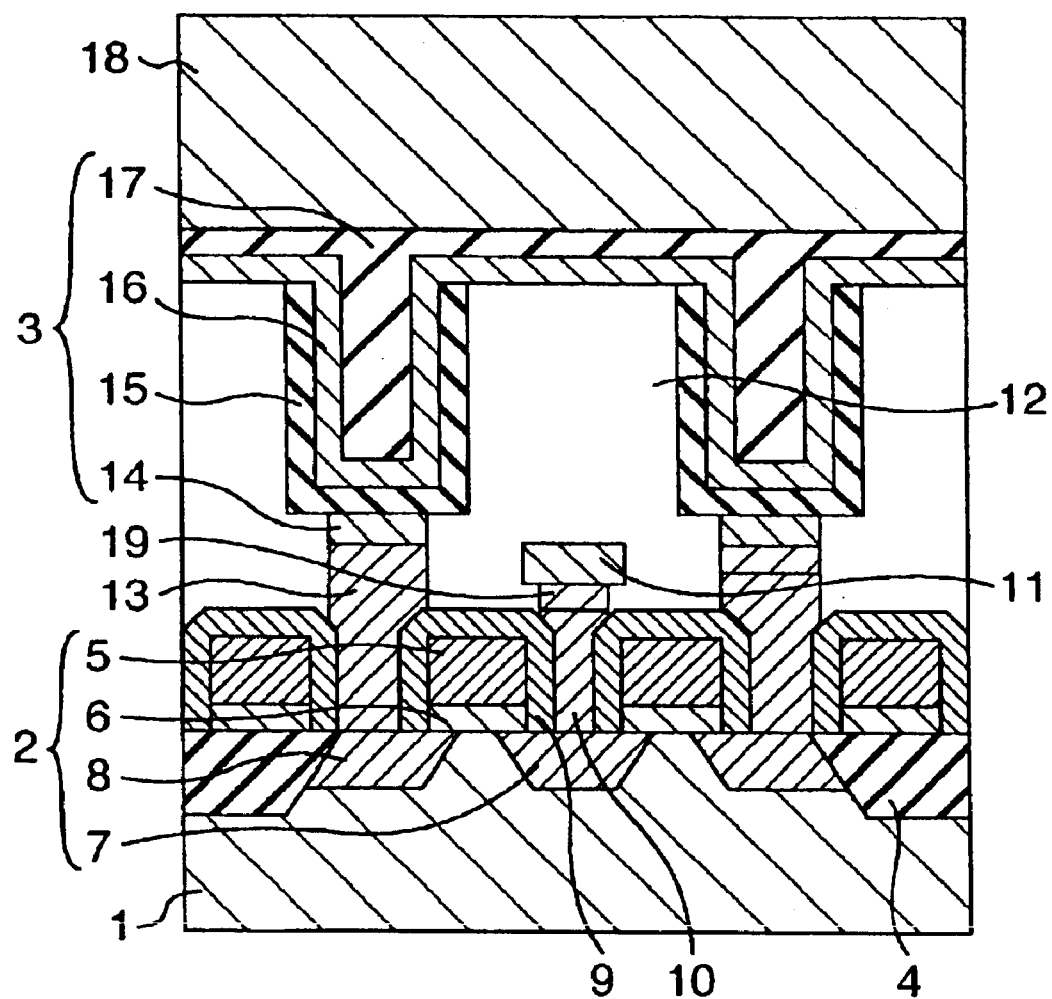
FIG. 5 is a cross-sectional view of the principal part of a semiconductor device according to Example 2 of the present invention.

Cross-sectional structure of DRAM memory cell is shown in FIG. 5 as a second embodiment of the present semiconductor device. FIG. 5 is also a cross-sectional view along A-B or C-D in an example of plan layout shown in FIG. 2. This embodiment differs from the first embodiment in conductive film 19 consisting, for example, of tungsten nitride or titanium nitride, formed below bit line 11. When plug 10 is composed of polycrystalline silicon as the main constituent element, there is such a risk that the silicon element diffusion into bit line 11 from plug 10, deteriorating device characteristics, and conductive film 19 thus acts as a barrier against such diffusion. One or more layers of another film may be provided between conductive film 19 and plug 10.

EXAMPLE 3

Figure 6:
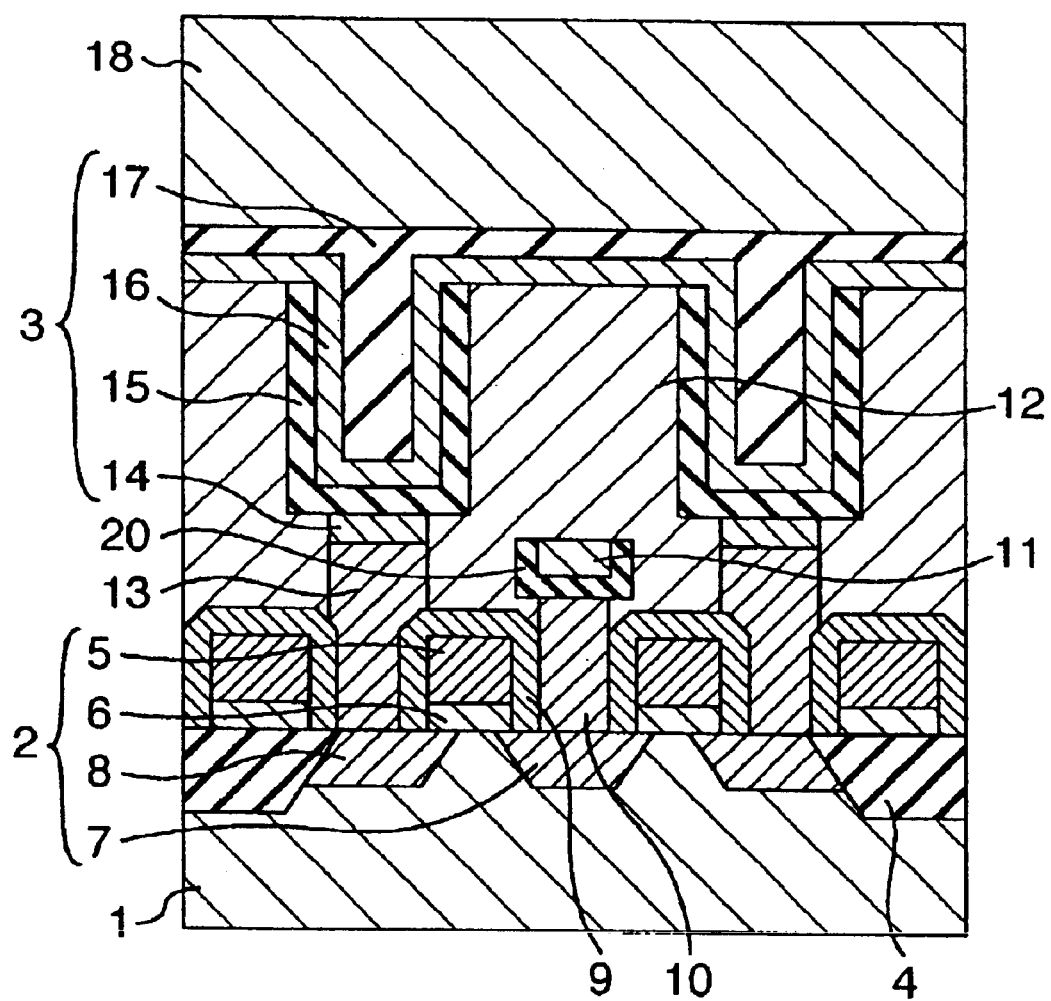
FIG. 6 is a cross-sectional view of the principal part of a semiconductor device according to Example 3 of the present invention.

Cross-sectional structure of DRAM memory cell is shown in FIG. 6 as a third embodiment of the present invention. FIG. 6 is also a cross-sectional view along A-B or C-D in an example of plan layout shown in FIG. 2. the third embodiment differs from the first embodiment in conductive film 20 formed on the bottom and sides of bit line 11 so as to make breaking of bit line 11 much less. Though not shown in the drawing, the conductive film as a barrier as shown in the second embodiment may be formed under conductive film 20 an overlay film may be provided on the top of bit line 11 so as to make breaking much less.

EXAMPLE 4

Figure 7:
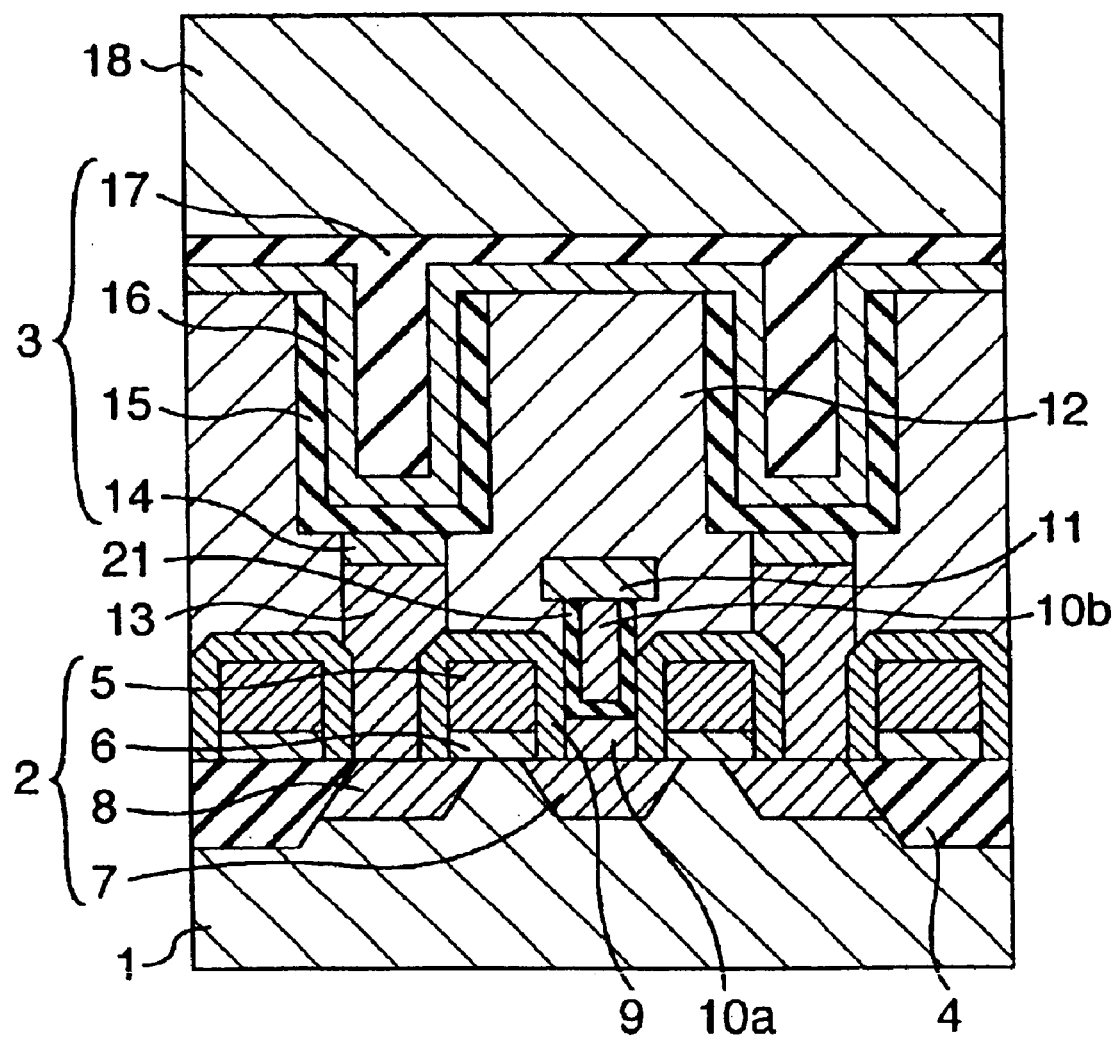
FIG. 7 is a cross-sectional view of the principal part of a semiconductor device according to Example 4 of the present invention.

Cross-sectional structure of DRAM memory cell is shown in FIG. 7 as a fourth embodiment of the present invention. FIG. 7 is also a cross-sectional view along A-B or C-D in an example of plan layout shown in FIG. 2. The fourth embodiment differs from the first embodiment in divided plugs such as plug 10a and plug 10b. Plug 10a in contact with silicon substrate 1 is formed preferably from polycrystalline silicon or silicide having a good compatibility with the substrate, whereas plug 10b is formed preferably from a metal with a low resistivity. In this case, conductive film 21 is formed preferably between plug 10a and plug 10b so that silicon atoms may not diffuse into plug 10b from plug 10a. In FIG. 7, conductive film 21 is formed on the sides of plug 10b but may be not on the sides. Plugs may be further divided into mote parts.

EXAMPLE 5

Figure 8:
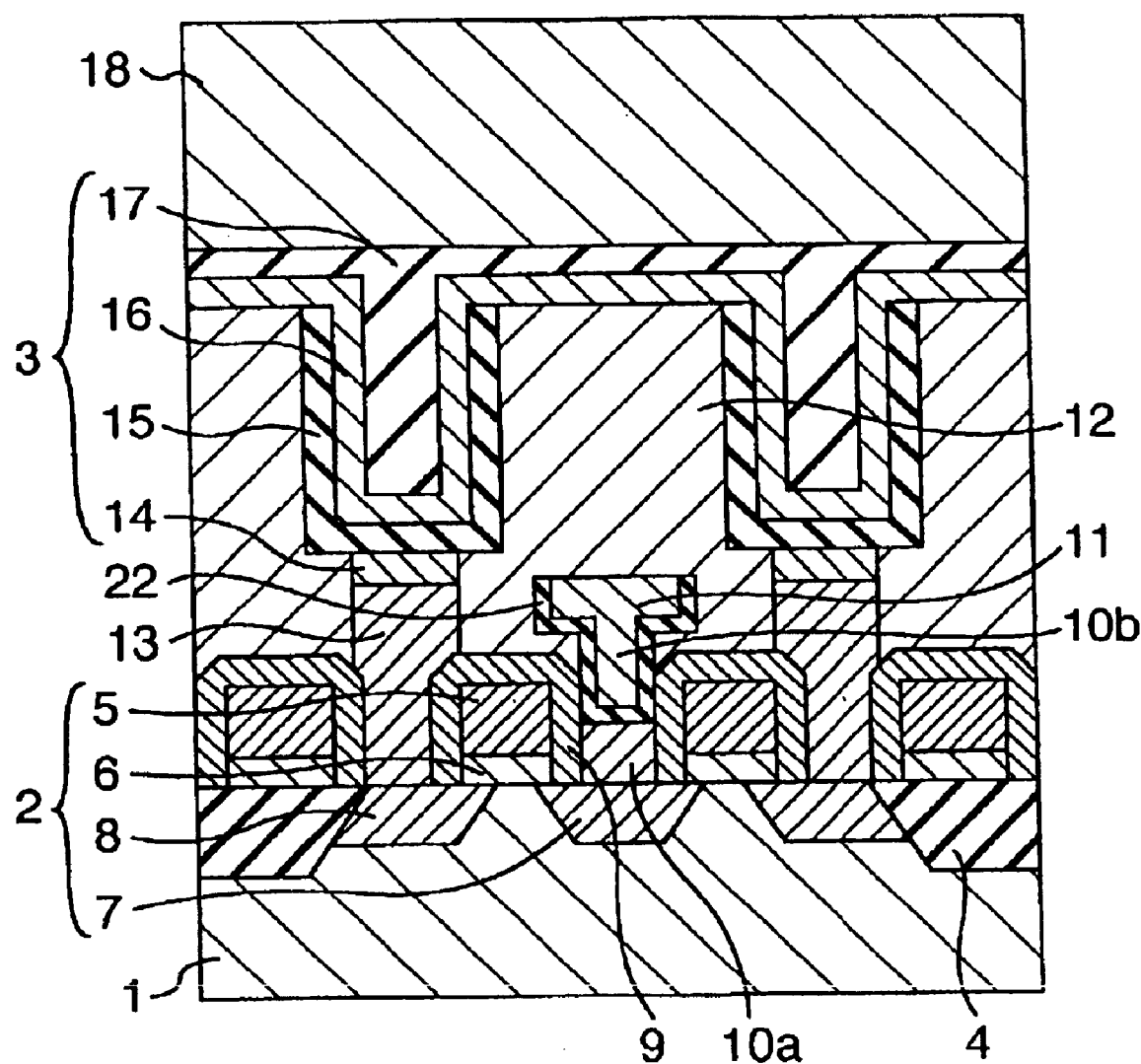
FIG. 8 is a cross-sectional view of the principal part of a semiconductor device according to Example 5 of the present invention.

Cross-sectional structure of DRAM memory cell is shown in FIG. 8 as a fifth embodiment of the present invention. FIG. 8 is also a cross-sectional view along A-B or C-D in an example of plan layout shown in FIG. 2. The fifth embodiment differs from the fourth embodiment in both bit line 11 and plug 10b being formed from the same material and conductive film 22 being formed on the bottoms and sides thereof, thereby proving a structure to cause breaking to take place less.

EXAMPLE 6

Figure 9:
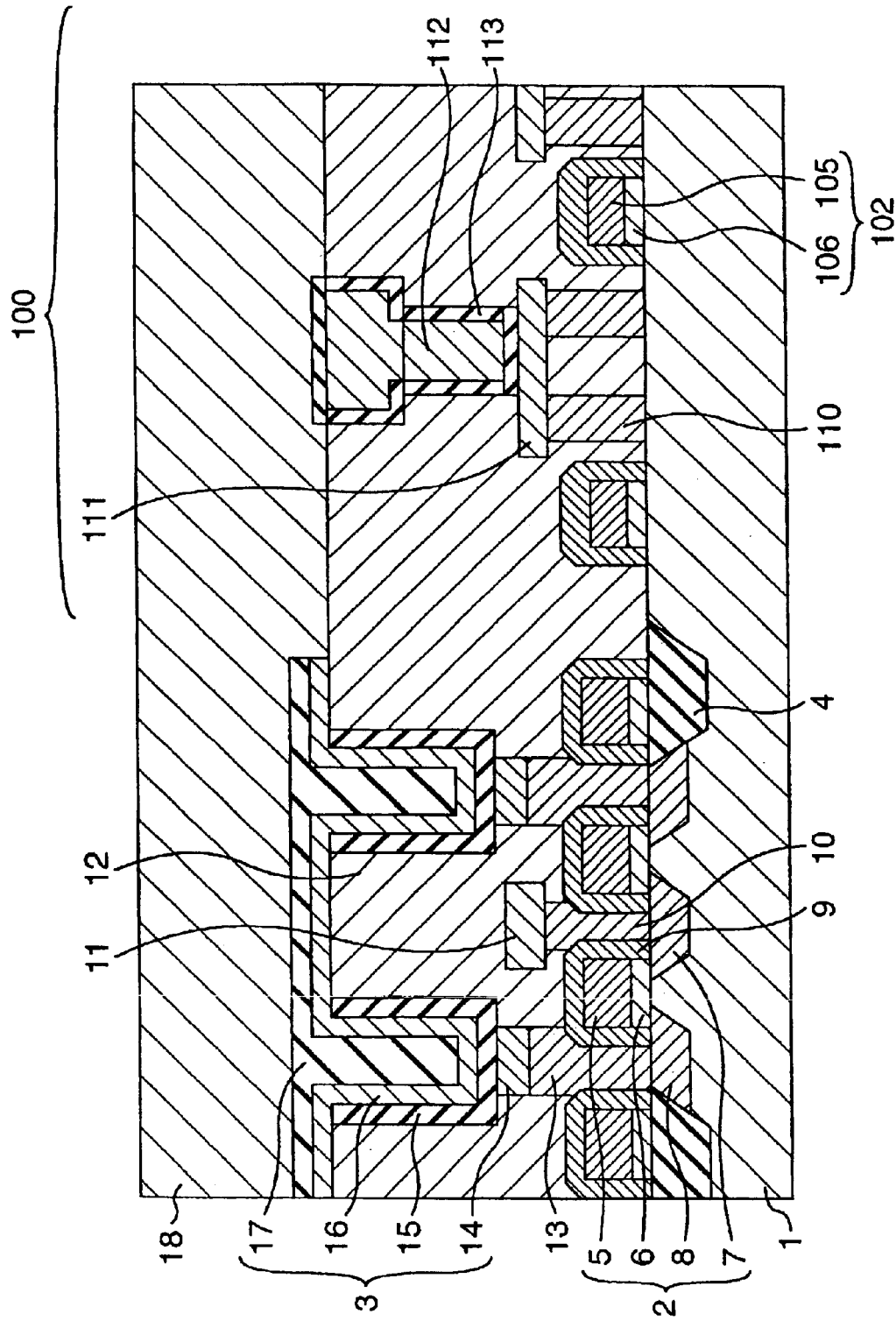
FIG. 9 is a cross-sectional view of the principal part of a semiconductor device according to Example 6 of the present invention.

Cross-sectional structure of a semiconductor device is shown in FIG. 9 as a sixth embodiment of the present invention. The sixth embodiment differs from the foregoing embodiments in mounting of logic LSI 100 in addition to DRAM. Logic LSI 100 comprises MOS transistor 102 comprising gate electrode 10s5 and gate insulating film 106, plug 110, wiring 111 and wiring 112. The wiring may have an adjacent film such as barrier film 113. To reduce the size of the entire semiconductor device, it is preferable that the line width is smaller, but the smaller line width may cause breaking during the heat treatment. To prevent breaking, molybdenum-containing tungsten material is preferably used for at least one portion of line 111, line 112, etc.

In the foregoing embodiments, the gate electrode and the plug are also heat treated at 600° C.–700° C. or higher and thus may be broken in some cases. Molybdenum-containing tungsten material can be used as a gate electrode constituent material or plug constituent material to prevent breaking thereof.

Figure 10:
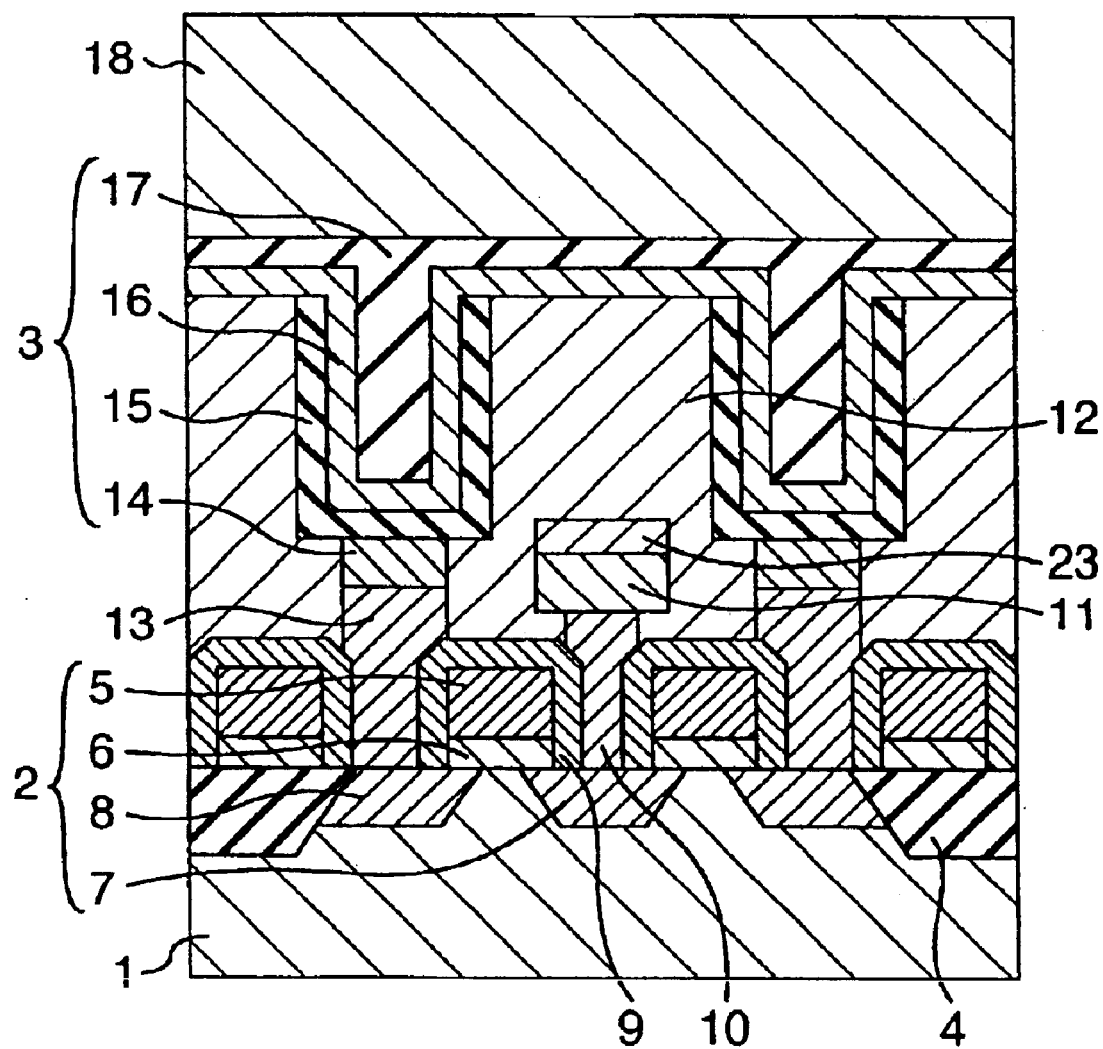
FIG. 10 is a view for illustrating one example of a method for adding molybdenum.

In the foregoing embodiments, the molybdenum-containing tungsten film may be formed, for example, by two-component sputtering or single component sputtering using a molybdenum-containing tungsten target, or by chemical vapor deposition using a mixed gas. As shown in FIG. 10, conductive film 23 composed of molybdenum as the main constituent material may be formed on bit line 11 and then heat treated to add molybdenum to bit line 11. Conductive film composed of molybdenum as the main constituent material may be formed as an underlayer below bit line 11 on as an intermediate layer of bit line 11 and then heat treated to add molybdenum to bit line 11.

According to the present invention, a highly reliable semiconductor device can be provided, a semiconductor device with a high yield can be provided, and a semiconductor device with an interconnect structure to cause breaking to take place less can be provided.

What is claimed:

1. A semiconductor device comprising:
    a semiconductor substrate;
    a metal interconnect comprised of tungsten as a main constituent material and containing molybdenum formed on one principal side of the semiconductor substrate;
    a capacitor component comprising a first electrode and a second electrode formed on said one principal side of the semiconductor substrate wherein a high dielectric constant film or a ferroelectric film is formed between the first electrode and the second electrode; and
    a plug electrically connected with the metal interconnect and the semiconductor substrate and comprised of tungsten as a main constituent.

2. A semiconductor device according to claim 1, wherein the metal interconnect and the plug are made of the same material.

3. A semiconductor device according to claim 1, wherein the plug is placed so as to connect the metal interconnect and the semiconductor substrate.

4. A semiconductor device according to claim 1, wherein the metal interconnect is a bit line.

5. A semiconductor device according to claim 1, wherein the metal interconnect has a wiring width of 0.2 μm or less.

6. A semiconductor device according to claim 1, wherein the wiring contains molybdenum in an amount of 0.05 at. % to 18 at. %.

7. A semiconductor device according to claim 1, wherein the high dielectric constant film or the ferroelectric film is an oxide film made of a material selected from the group consisting of tantalum oxide, barium strontium titanate and lead titanate zirconate.

8. A semiconductor device according to claim 1, wherein a memory LSI and a logic LSI are mounted on the semiconductor substrate.

9. A semiconductor device comprising:
    a semiconductor substrate;
    a metal interconnect comprised of tungsten as a main constituent material and containing molybdenum formed on one principal side of the semiconductor substrate;
    a capacitor component comprising a first electrode and a second electrode formed on said one principal side of the semiconductor substrate wherein a high dielectric constant film or a ferroelectric film is formed between the first electrode and the second electrode; and
    a plug electrically connected with the metal interconnect and the semiconductor substrate and comprised of tungsten as a main constituent,
    wherein an area of the metal interconnect containing tungsten as a main constituent and an area of the plug containing tungsten as a main constituent are connected.

10. A semiconductor device comprising:
    a semiconductor substrate;
    a metal interconnect comprised of tungsten as a main constituent material and containing molybdenum formed on one principal side of the semiconductor substrate;
    a capacitor component comprising a first electrode and a second electrode formed on said one principal side of the semiconductor substrate, wherein a high dielectric constant film or a ferroelectric film is formed between the first electrode and the second electrode; and a plug electrically connected with the metal interconnect and the semiconductor substrate, wherein the metal interconnect and the plug, each having an area covered with an electroconductive film, are surrounded by an insulating film.

11. A semiconductor device according to claim 10, wherein the electroconductive film is formed on bottoms and sides of the plug and the metal interconnect.

12. A semiconductor device according to claim 10, wherein the electroconductive film covering the plug and the electroconductive film covering the metal interconnect are connected.

13. A semiconductor device according to claim 10, wherein the electroconductive film contains tungsten nitride or titanium nitride.

* * * * *